(12) United States Patent
Grenier et al.

(10) Patent No.: US 9,218,862 B1
(45) Date of Patent: Dec. 22, 2015

(54) METHOD AND APPARATUS FOR OPERATING FINITE-STATE MACHINES IN CONFIGURABLE STORAGE CIRCUITS

(71) Applicant: Altera Corporation, San Jose, CA (US)

(72) Inventors: Richard Arthur Grenier, San Jose, CA (US); Carl Ebeling, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/251,423

(22) Filed: Apr. 11, 2014

(51) Int. Cl.
*G11C 8/00* (2006.01)
*G11C 8/16* (2006.01)
*G11C 7/18* (2006.01)
*G11C 8/12* (2006.01)
*G11C 11/412* (2006.01)
*G11C 7/10* (2006.01)

(52) U.S. Cl.
CPC .. *G11C 8/16* (2013.01); *G11C 7/18* (2013.01); *G11C 8/12* (2013.01); *G11C 11/412* (2013.01); *G11C 7/1075* (2013.01)

(58) Field of Classification Search
CPC .......... G11C 18/16; G11C 18/12; G11C 7/18; G11C 7/1075; G11C 11/412
USPC ........................................ 365/230.05, 230.01
See application file for complete search history.

(56) References Cited

U.S. PATENT DOCUMENTS

| | | | |
|---|---|---|---|
| 6,097,988 A * | 8/2000 | Tobias | 700/23 |
| 6,803,787 B1 | 10/2004 | Wicker, Jr. | |
| 6,978,234 B1 | 12/2005 | Battaline et al. | |
| 7,603,603 B2 | 10/2009 | Dubey | |
| 8,513,979 B2 * | 8/2013 | Lin | 327/18 |
| 8,681,819 B2 | 3/2014 | Abel et al. | |
| 8,873,329 B1 * | 10/2014 | Zheng et al. | 365/230.01 |
| 2014/0025614 A1 | 1/2014 | Noyes et al. | |

\* cited by examiner

*Primary Examiner* — Pho M Luu
(74) *Attorney, Agent, or Firm* — Jason Tsai

(57) ABSTRACT

An integrated circuit may have circuitry that includes a storage circuit, a processing circuit, and at least one state register to implement a finite-state machine. The storage circuit may store base addresses and output data for each state of the finite-state machine. The storage circuit may further store offset values that are based on the input data to the finite-state machine and the state transition from a current state to a next state caused by the input data. The processing circuit may compute the address of the storage circuit location where the output data of the next state is stored. The computation of this address may depend on the offset value and base address of the current state. The state register may receive the address from the processing circuit, store the address, and perform the corresponding memory access operation on the storage circuit.

22 Claims, 11 Drawing Sheets

| ADDRESS | OFFSET |
|---|---|
| 0x00 | 0 |
| 0x01 | 0 |
| 0x10 | 1 |
| 0x11 | 1 |

FIG. 2C

| ADDRESS | BASE ADDRESS | OUTPUT FUNCTION OF STATE |
|---|---|---|
| 0x000 | 0x010 | OUT(S0) |
| 0x001 | 0x100 | OUT(S0) |
| 0x010 | 0x100 | OUT(S1) |
| 0x011 | 0x000 | OUT(S1) |
| 0x100 | 0x000 | OUT(S2) |
| 0x101 | 0x010 | OUT(S2) |

FIG. 2D

METHOD AND APPARATUS FOR OPERATING FINITE-STATE MACHINES IN CONFIGURABLE STORAGE CIRCUITS

BACKGROUND

This invention relates to integrated circuits and, more particularly, to configurable storage blocks in an integrated circuit.

Considering a programmable logic device (PLD) as one example of an integrated circuit, as applications for which PLDs are used increase in complexity, it has become more common to design PLDs to include specialized blocks such as configurable storage blocks in addition to blocks of generic programmable logic.

Configurable storage blocks are often arranged in arrays of memory elements. In a typical array, data lines are used to write data into and read data from the configurable storage blocks. Address lines may be used to select which of the memory elements are being accessed. A configurable storage block is typically configurable to implement a memory of a predetermined depth and width, whereby the maximum depth is based on the number of address lanes and the maximum width on the number of data lanes.

SUMMARY

In accordance with certain aspects of the invention, circuitry which has a clock port and input and output ports and which includes a storage circuit, a processing circuit, and at least one state register is presented. The storage circuit may be coupled to the output ports and store a first base address and first output data of a first state of a finite-state machine at a first address. The processing circuit may receive input data from the input ports and the first base address from the storage circuit and compute a second address based on the received first base address and the received input data. The storage circuit may store a second base address and second output data of a second state of the finite-state machine at the second address. The state register may be coupled to the storage circuit and receive a clock signal from the clock port and the second address from the processing circuit and store the second address at a triggering event of the clock signal.

It is appreciated that the present invention can be implemented in numerous ways, such as a process, an apparatus, a system, a device, or instructions executed on a programmable processor. Several inventive embodiments of the present invention are described below.

In certain embodiments, the above-mentioned processing circuit may include an arithmetic operator circuit that receives the input data and the first base address and performs an arithmetic function on the received input data and first base address to compute the second address.

In certain embodiments, the above-mentioned storage circuit may store a selection signal at the first address and the circuitry may include a selector circuit that is coupled to the state register. The selector circuit may receive the second address from the processing circuit and the first base address and the selection signal from the storage circuit and select between the second address and the first base address based on the selection signal.

Further features of the invention, its nature and various advantages, will be more apparent from the accompanying drawings and the following detailed description of the preferred embodiments.

BRIEF DESCRIPTION OF THE DRAWINGS

FIG. 2C is a diagram of an illustrative memory array that stores a branch table of the finite-state machine of FIG. 2B in accordance with an embodiment of the present invention.

FIG. 2D is a diagram of an illustrative memory array that stores base addresses of the next states and output function of the finite-state machine of FIG. 2B in accordance with an embodiment of the present invention.

DETAILED DESCRIPTION

Figure 1:
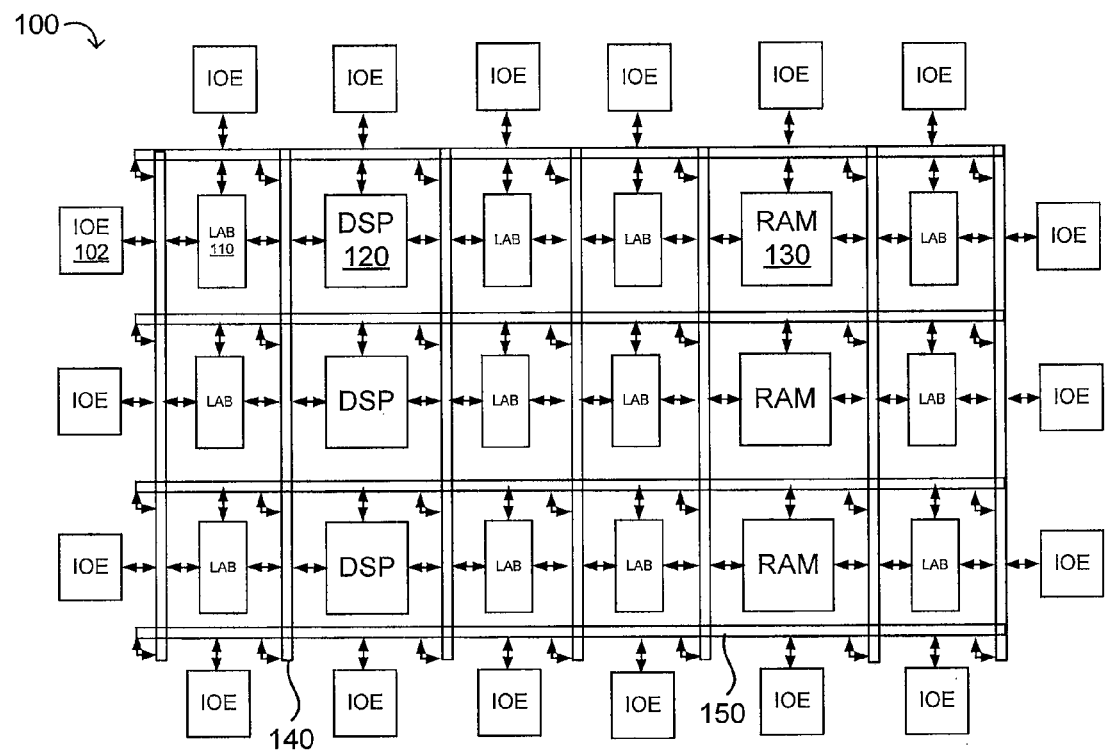
FIG. 1 is a diagram of an illustrative integrated circuit with embedded configurable storage circuits in accordance with an embodiment of the present invention.

The present invention relates to integrated circuits and more specifically to configurable storage blocks in an integrated circuit.

Conventional configurable storage blocks often support a pure memory use model in which write operations store data in a memory array at a predetermined address and in which subsequent read operations retrieve the stored data. Typically, only a portion of a user design performs such memory operations and this portion may vary depending on the design while some integrated circuits may provide a fixed number of configurable storage blocks. Thus, situations frequently arise where the implementation of a user design on an integrated circuit leaves some of the available configurable storage blocks unused. Consequently, in an effort to use the available circuit area more efficiently, it would be desirable to implement other portions of the user design on these otherwise unused configurable storage blocks.

For this purpose, a modified configurable storage block with additional circuitry (e.g., with a processing circuit and registers in addition to the memory array) may be provided. Such a modified configurable storage block may facilitate the efficient implementation of typical design constructs such as the implementation of a finite-state machine (FSM).

A finite-state machine (FSM), a finite-state automaton, or simply a state machine is a mathematical model of computation used to design sequential logic circuits and computer programs. A finite-state machine may be implemented in an integrated circuit as a sequential logic circuit with a storage component that stores information about past inputs that can be used to compute future outputs. The storage component, which is sometimes also referred to as a state register or a memory element, holds the current state, which together with the information about past inputs may be all that is needed to compute future outputs. The FSM contains two combinational functions, the output function and the next state function. The output function computes the outputs of the FSM and the next state function computes the next state of the FSM. These functions are functions of the inputs and the current state of the FSM.

An FSM typically starts in an initial state, which may be reached by asserting a reset signal. The reset signal may be part of the inputs. Alternatively, the reset signal may be a special signal that initializes the state register to the initial state. The FSM then operates under the control of a clock signal. A triggering event of the clock signal which is sometimes also referred to as a clock event causes the memory element to capture the value of its inputs. What constitutes a triggering event of the clock signal depends on the memory element. For example, a rising edge, a falling edge, or a rising and falling edge of the clock signal may be a triggering event if the memory element is edge sensitive. The triggering event of the clock signal may also be a logic "1" or logic "0" in case of a level sensitive memory element. The memory element may transfer and hold the captured value on the outputs until the next clock event. Each clock event causes the FSM to transition from one state to the next in accordance with the FSM inputs, current state and the next state function.

Two types of finite-state machines are distinguished. If the output function of the finite-state machine is a function of the next state only, then the FSM is known as a Moore finite-state machine, and otherwise the FSM is known as a Mealy finite-state machine.

Mealy FSMs compute their current output values based in part on the inputs. Thus, Mealy FSMs can react immediately to changes on the input. However, the outputs of Mealy FSMs are not stable until the inputs are stable and the output function has computed the new output value. By contrast, the outputs of Moore FSMs cannot react to new inputs until the next state, that is, until the next clock event takes place. The outputs of Moore FSMs are available after the next clock event, after the output function has computed the outputs from the new current state value. In Moore FSMs the input-to-output function is pipelined, leading to predictable output delay and higher performance compared to Mealy FSMs whose outputs are the result of a combinational function involving the current inputs.

Providing an integrated circuit with a modified configurable storage block which allows for efficient implementations of finite-state machines (including both Moore and Mealy type state machines) has several advantages. Such a modified configurable storage block may implement any finite-state machine in a user's design and thus mitigate the need for finite-state machine specific logic and routing resources in the integrated circuit, thereby potentially reducing the logic resource usage and routing congestion. The finite-state machine implementation may also have deterministic timing and improved performance compared to alternative implementations of the finite-state machine, and any engineering change order (ECO) such as adding or removing a state, changing the state transition function, or changing the output values of a state may be performed by reconfiguring the configurable storage block and thus without any impact on routing congestion or timing of the integrated circuit implementation.

It will be recognized by one skilled in the art, that the present exemplary embodiments may be practiced without some or all of these specific details. In other instances, well-known operations have not been described in detail in order not to unnecessarily obscure the present embodiments.

An illustrative embodiment of an integrated circuit such as a programmable logic device (PLD) 100 with a modified configurable storage block in accordance with the present invention is shown in FIG. 1. Programmable logic device 100 may have input/output circuitry 102 for driving signals off of PLD 100 and for receiving signals from other devices. Input/output circuitry 102 include conventional input/output circuitry, serial data transceiver circuitry, differential receiver and transmitter circuitry, or other circuitry used to connect one integrated circuit to another integrated circuit.

As shown, input/output circuitry 102 may be located around the periphery of the chip. If desired, the programmable logic device may have input/output circuitry 102 arranged in different ways. For example, input/output circuitry 102 may form one or more columns of input/output circuitry that may be located anywhere on the programmable logic device (e.g., distributed evenly across the width of the PLD). If desired, input/output circuitry 102 may form one or more rows of input/output elements (e.g., distributed across the height of the PLD). Alternatively, input/output circuitry 102 may form islands of input/output elements that may be distributed over the surface of the PLD or clustered in selected areas.

Vertical interconnection resources 140 and horizontal interconnection resources 150 such as global and local vertical and horizontal conductive lines and buses may be used to route signals on PLD 100. Vertical and horizontal interconnection resources 140 and 150 include conductive lines and programmable connections between respective conductive lines and are therefore sometimes referred to as programmable interconnects.

Programmable logic regions may include programmable components such as digital signal processing circuitry 120, storage circuitry 130, or other combinational and sequential logic circuitry organized in logic array blocks 110. The programmable logic regions may be configured to perform a custom logic function. If desired, the programmable logic region may include digital signal processing circuitry 120 and storage circuitry 130 which both may be organized in specialized blocks that have limited configurability. The programmable logic region may include additional specialized blocks such as programmable phase-locked loop circuitry, programmable delay-locked loop circuitry, or other specialized blocks with limited configurability.

Programmable logic device 100 contains programmable memory elements. These memory elements can be loaded with configuration data (sometimes also referred to as programming data) using input/output circuitry 102. Once loaded, the memory elements each provide a corresponding static control signal that controls the operation of an associated logic component in a programmable logic region. In a typical scenario, the outputs of the loaded memory elements are applied to the gates of transistors in the programmable logic region to turn certain transistors on or off and thereby configure the logic and the routing paths in the programmable logic region. Programmable logic circuit elements that may be controlled in this way include parts of multiplexers (e.g., multiplexers used for forming routing paths in programmable interconnects), look-up tables, logic arrays, AND, OR, NAND, and NOR logic gates, pass gates, etc.

Memory elements may use any suitable volatile and/or non-volatile memory structures such as random-access-memory (RAM) cells, fuses, antifuses, programmable read-only-memory memory cells, mask-programmed and laser-programmed structures, combinations of these structures, etc. Because memory elements are loaded with configuration data during programming, memory elements are sometimes referred to as configuration memory, configuration RAM, or programmable memory elements.

The circuitry of programmable logic device 100 may be organized using any suitable architecture. As an example, the logic of programmable logic device 100 may be organized in a series of rows and columns of larger programmable logic regions each of which contains multiple smaller logic regions. The smaller regions may be, for example, regions of logic that are sometimes referred to as logic elements (LEs), each containing a look-up table, one or more registers, and programmable multiplexer circuitry. The smaller regions may also be, for example, regions of logic that are sometimes referred to as adaptive logic modules (ALMs). Each adaptive logic module may include a pair of adders, a pair of associated registers and a look-up table or other block of shared combinational logic (i.e., resources from a pair of LEs—sometimes referred to as adaptive logic elements or ALEs in this context). The larger regions may be, for example, logic array blocks (LABs) containing multiple logic elements or multiple ALMs.

During device programming, configuration data is loaded into programmable logic device 100 that configures the programmable logic regions so that their logic resources perform desired logic functions.

Figure 2A:
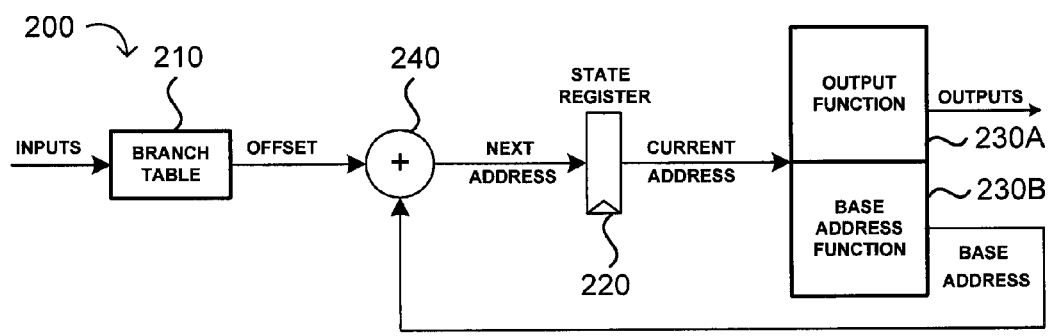
FIG. 2A is a diagram of an illustrative finite-state machine design implemented in a configurable storage circuit in accordance with an embodiment of the present invention.

At least a portion of storage circuitry 130 may be implemented as a modified configurable storage block with added functionality to implement finite-state machines efficiently. FIG. 2A shows a finite-state machine implementation using an embodiment of such a modified configurable storage block.

Configurable storage block 200 may include a memory array, state registers, and processing circuitry. The next state function of the finite-state machine may be factored into two components, an offset and a base address. A branch table may encode the portion of the next state function that is based on the inputs and generate the appropriate offset value. A base address function may encode the portion of the next state function that is based on the current state of the state machine and provide the appropriate base address.

The memory array of configurable storage block 200 may store information related to the output function and the next state function of the finite-state machine. For example, the memory array may store output function 230A and base address function 230B. The memory array may also store branch table 210. Alternatively, branch table 210 may be calculated by the processing circuitry based on the inputs or stored in a look-up table or an additional memory array addressed by the inputs. The additional memory array may be a physically different memory array or the same memory array that stores output function 230A and base address function 230B. For example, one bank of the memory array may store output function 230A and base address function 230B accessible by a first address space while a different bank of the same memory array stores branch table 210 which may be accessible by a second, different address space. Configurable storage block 200 may also provide true-dual port access mode to the memory array in which case one port may provide access to branch table 210 and the other port may provide access to output function 230A and base address function 230B.

State registers 220 of configurable storage block 200 may store information about the current state of the finite-state machine. The information about the current state that is held by the state register 220 is in form of the address of the location in the memory array where the output function 230A and the base address function 230B associated with the current state is stored. The state register 220 must hold the address that is associated with the current state while the memory access is performed.

Processing circuitry (e.g., adder circuit 240 of configurable storage block 200) may combine the base address associated with the current state and the offset associated with the current inputs to compute information related to the next state. The information about the next state is in form of the address of the location in the memory array where the output function 230A and the base address function 230B of the next state is stored. The address associated with the next state is stored in state register 220 at the next clock event. For example, adder circuit 240 may add the base address of the current state retrieved from base address function 230B to the offset value retrieved from branch table 210 and the sum may represent the address of the memory array that holds the outputs and the base address of the next state.

Figure 2B:
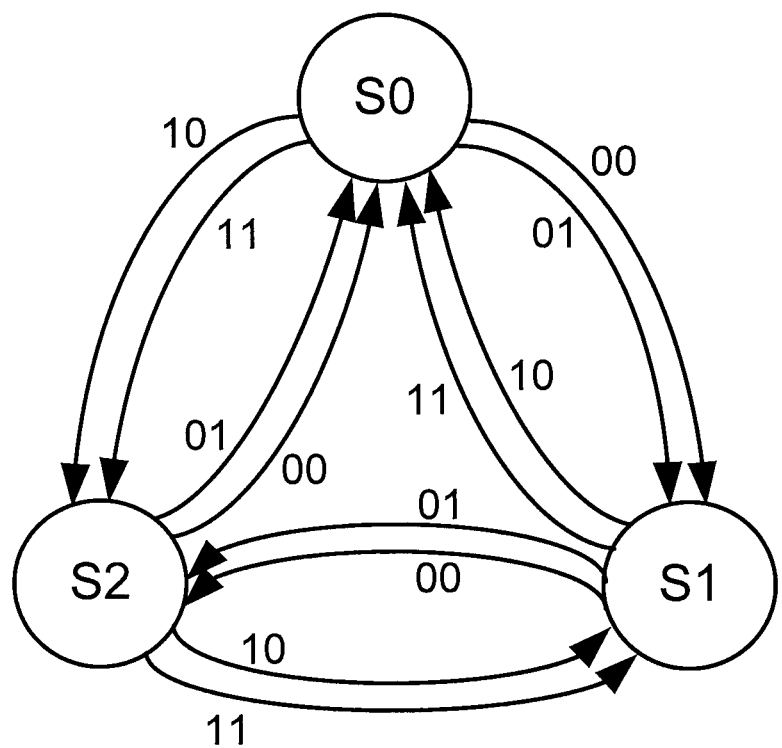
FIG. 2B is a diagram of an illustrative finite-state machine with three states in accordance with an embodiment of the present invention.

As an example, consider a finite-state machine with three states (e.g., state S0, state S1, and state S2) and two inputs as shown in FIG. 2B. The two inputs may take four values such as "00", "01", "10", and "11". For input values "00" and "01", state S0 may transition to state S1, state S1 to state S2, and state S2 to state S0. For input values "10" and "11", state S0 may transition to state S2, state S1 to state S0, and state S2 to state S1.

In the example, input values "00" and "01" produce the same state transitions across all states (i.e., for each of the current states S0, S1, and S2, the next state can be generated using the expression next_state=(current_state +1) modulo 2), and input values "10" and "11" produce the same state transitions across all states (i.e., for each of the current states S0, S1, and S2, the next state can be generated using the expression next_state=(current_state +2) modulo 2). Thus, a first group may include inputs "00" and "01" and a second group may include inputs "10" and "11".

In the example, a branch table encoder may assign a first offset value (e.g., "0") to the first group and a second offset value (e.g., "1") to the second group. In other words, the branch table may produce an offset value of "0" for inputs "00" and "01" and an offset value of "1" for inputs "10" and "11". A memory array may serve as branch table and store the offset values. An embodiment of a memory array that may store offset values of a branch table such as branch table 210 of FIG. 2A for the finite-state machine of FIG. 2B is shown in FIG. 2C.

Figure 2C:
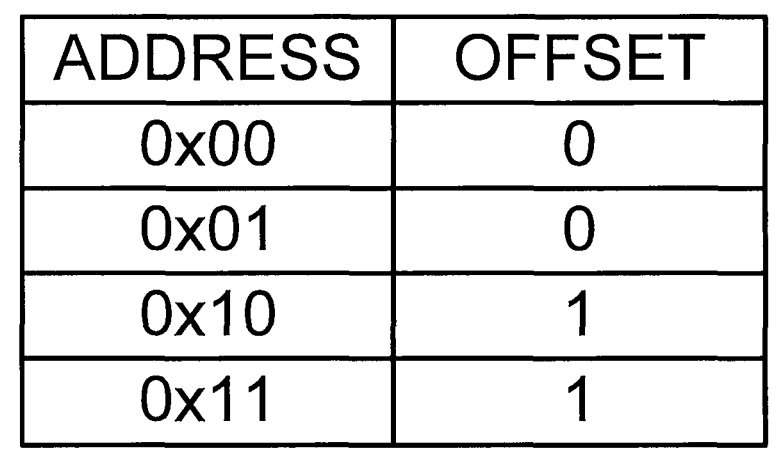

As shown in FIG. 2C, the inputs may directly address the offset values stored in the memory array. For example, inputs "00" and "01" may access addresses 0x00 and 0x01 of the memory array respectively and retrieve offset value "0". Similarly, inputs "10" and "11" may access addresses 0x10 and 0x11 of the memory array respectively and retrieve offset value "1".

An additional memory array shown in FIG. 2D may store the base addresses of the respective next states and the output function for the finite-state machine shown in FIG. 2B. For example, the memory array may be a true-dual port memory with address lines of both ports tied together. One port of the true-dual port memory may provide access to the base address function (e.g., base address function 230B of FIG. 2A) while the other port provides access to the output function (e.g., output function 230A of FIG. 2A).

As shown in FIG. 2D, the memory array may store at addresses 0x000, 0x001, 0x010, 0x011, 0x100, and 0x101 the base addresses 0x010, 0x100, 0x100, 0x000, 0x000, and 0x010, respectively. For the same example, the memory array may also store the output function of state S0 (i.e., OUT(S0)) at addresses 0x000 and 0x001, the output function of state S1 (i.e., OUT(S1)) at addresses 0x010 and 0x011, and the output function of state S2 (i.e., OUT(S2)) at addresses 0x100 and 0x101. A method for encoding the base addresses is described below with FIG. 3B.

Figure 3A:
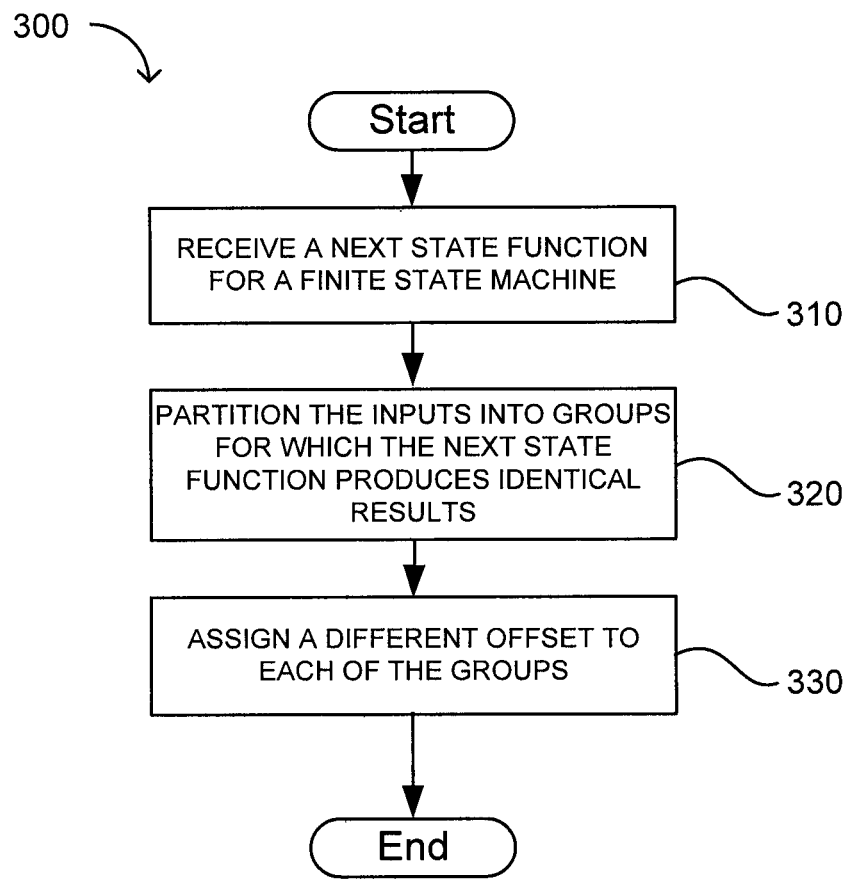
FIG. 3A is a flow chart showing illustrative steps for computing offset values based on the next state function of a finite-state machine in accordance with an embodiment of the present invention.

As previously described, the branch table may encode the portion of the next state function that is based on the inputs. The goal of the encoding is to compress the information contained in the inputs into a fewer offset values thereby reducing the size of memory required to store the portion of the next state function related to the inputs which in turn may provide for a cheaper implementation for the same number of inputs, or a larger number of inputs for the same amount of memory. Illustrative steps for encoding the inputs to generate a branch table are shown in FIG. 3A.

During step 310, a branch table encoder may receive a next state function for a finite-state machine. The next state function may show state transitions from a current state to a next state based on the inputs and the respective states. As an example, consider the finite-state machine shown in FIG. 2B.

During step 320, the branch table encoder may partition the inputs into groups for which the next state function produces identical results. In other words, the branch table encoder analyzes the inputs and the next state function and assigns inputs for which the next state function produces an identical state transition across multiple states into a same group. In the example, input values "00" and "01" produce the same state transitions across all states, and input values "10" and "11" produce the same state transitions across all states. Thus, a first group may include inputs "00" and "01" and a second group may include inputs "10" and "11".

During step 330, the branch table encoder may assign a different offset value to each of the groups determined during step 320. In the example, the encoder may assign a first offset value (e.g., "0") to the first group and a second offset value (e.g., "1") to the second group. In other words, the branch table may produce an offset value of "0" for inputs "00" and "01" and an offset value of "1" for inputs "10" and "11". The choice of consecutive offset values for the two groups is merely illustrative and not intended to limit the scope of the present invention. If desired, the branch table encoder may assign any two different offset values to the two groups and the selected offset values may be manipulated by processing circuitry to determine appropriate next addresses.

Figure 3B:
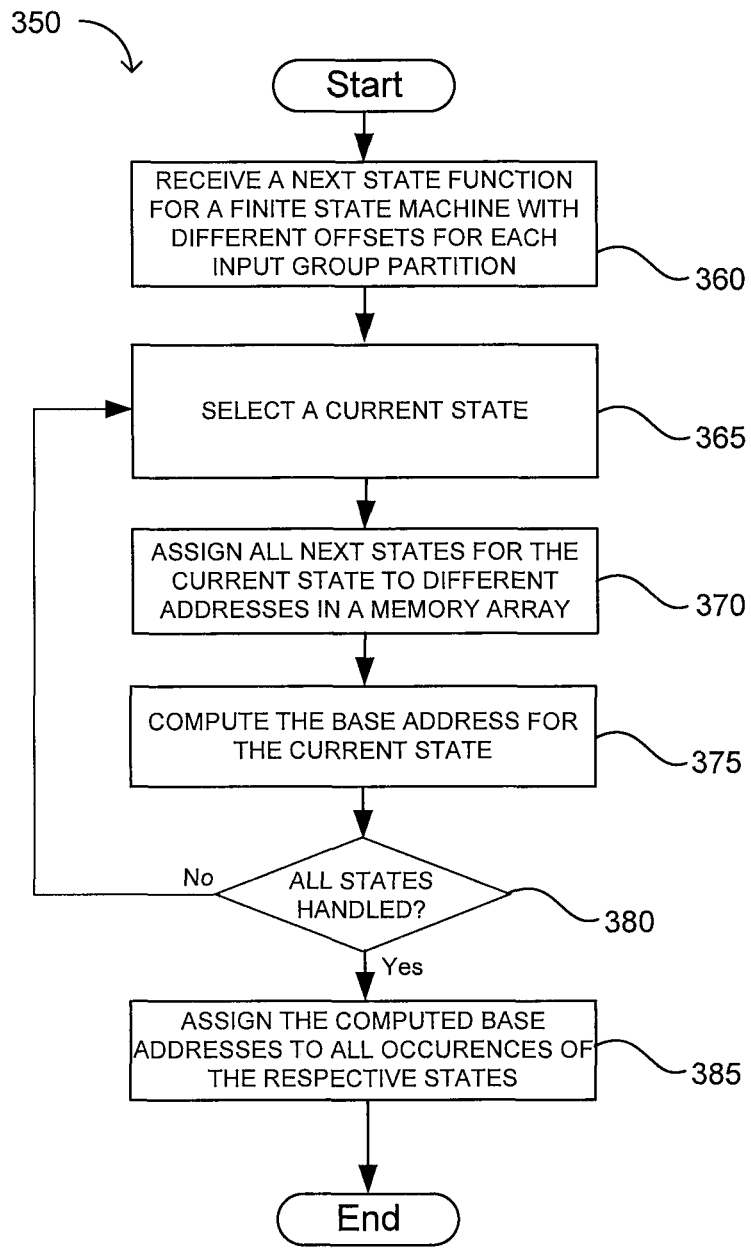
FIG. 3B is a flow chart showing illustrative steps for computing base addresses based on the offset values and the next state function of a finite-state machine in accordance with an embodiment of the present invention.

As previously described, the base address function may encode the portion of the next state function that is based on the current state. Illustrative steps for generating the base address function are shown in FIG. 3B. During step 360, a base address function encoder may receive a next state function of a finite-state machine with offset values computed for each group of inputs (e.g., using a branch table encoder to execute the steps described in FIG. 3A). As an example, consider the finite-state machine of FIG. 2B.

During step 365, the base address encoder may select one of the states of the finite-state machine as a current state. In the example, the base address encoder may select state S0. During step 370, the base address encoder may assign all next states for the current state to different addresses in a memory array. In the example of FIG. 2B, state S0 may transition to states S1 and S2, but state S0 may not remain in state S0 (i.e., S0 is not a next state for S0). Thus, state S1 may be assigned to a location in the memory array determined by a first address, and state S2 may be assigned to a location in the memory array determined by a second address, whereby the first and second address are different from each other. The difference between the first and second address may be based on the difference in offset value that is assigned to the state transition from state S0 to S1 versus the state transition from state S0 to S2.

Consider the scenario in which the processing circuitry (e.g., adder circuit 240 of FIG. 2A) computes the next address of the location in the memory array where the output function and the base address function is stored as a sum of the offset value according to the current inputs and the base address of the current state. Implementing the next address function as a sum of offset value and base address (i.e., using adder circuit 240 of FIG. 2A as the processing circuitry) is merely illustrative and is not intended to limit the scope of the present invention. If desired, any function of the offset value and the base address may compute the next address (e.g., next address=N+base address+K*offset, with N and K being integer values and N>=0 and K>0) with the effect that the output function and base address function for the next state needs to be stored at the location determined by the next address.

Thus, in order not to unnecessarily obscure the present embodiment, consider that the processing circuit implements a simple addition of offset value and base address and that the offset values determined by the branch table encoder are "0" and "1" as previously described (i.e., two state transitions have been identified for each state, a first state transition from each of the states to a first new state and a second state transition from each of the states to a second new state). In this scenario, the base address encoder may assign the first next state to a next state address of M plus the offset of the first next state and the second next state to a next state address of M plus the offset of the second next state. For example, M may be selected to be "0". In this scenario and with the offset values of "0" and "1" for next states S1 and S2 respectively for the current state S0, the base address encoder may select the next address associated with next state S1 to be address "0", and the next address associated with next state S2 to be address "1".

During step 375, the base address encoder may compute a base address for the current state. In the example, where the next state address is computed as the sum of offset value and base address, the base address encoder may compute the base address as the difference between next state addresses and the corresponding offset values. For example, with the next state information of state S0 located at next addresses "0" and "1" and corresponding offset values of "0" and "1", state S0 may receive a base address of "0".

As shown in FIG. 3B, the base address encoder first assigns all next states for the current state to a location in the memory array during step 370 followed by the computation of the base address for the current state during step 375. If desired, the base address encoder may first select a base address of the current state by determining a set of available locations in the memory array (e.g., a set of next addresses) for storing the next state information for the current state and only then assign the next states for the current state to the determined set of available locations.

During step 380, the base address encoder may verify if all states have been handled (i.e., if the base address encoder has assigned a base address to all states of the finite-state machine). In the example described previously, the base address encoder has assigned a base address to state S0 but not to states S1 and S2. Therefore, the base address encoder returns to step 365 to select a current state such as state S1. During step 370, the base address encoder may assign the next states to a location in the memory array and during step 375 compute the base address for the current state. For example, the base address encoder may assign the next states S2 and S0 of current state S1 to addresses "2" and "3" of the memory array, respectively. The base address encoder may subtract the respective offset values "0" and "1" from the addresses to compute "2" as the base address for current state S1.

During step 380, the base address encoder may determine that state S2 has not been assigned a base address and return to step 365 to select S2 as the current state. During step 370, the base address encoder may assign the next states S0 and S1 of current state S2 to addresses "4" and "5" of the memory array, respectively. The base address encoder may subtract the respective offset values "0" and "1" from the addresses to compute "4" as the base address for current state S2.

During step 380, the base address encoder may determine that all states have been assigned a base address. As a result, the base address encoder may assign all the computed base addresses to the occurrences of the respective states during step 385. In the example described previously, the memory array may store at addresses "0", "1", "2", "3", "4", and "5" the base addresses "2", "4", "4", "0", "0", and "2", respectively. For the same example, the memory array may also store the output function of state S0 at addresses "0" and "1", the output function of state S1 at addresses "2" and "3", and the output function of state S2 at addresses "4" and "5".

Figure 4A:
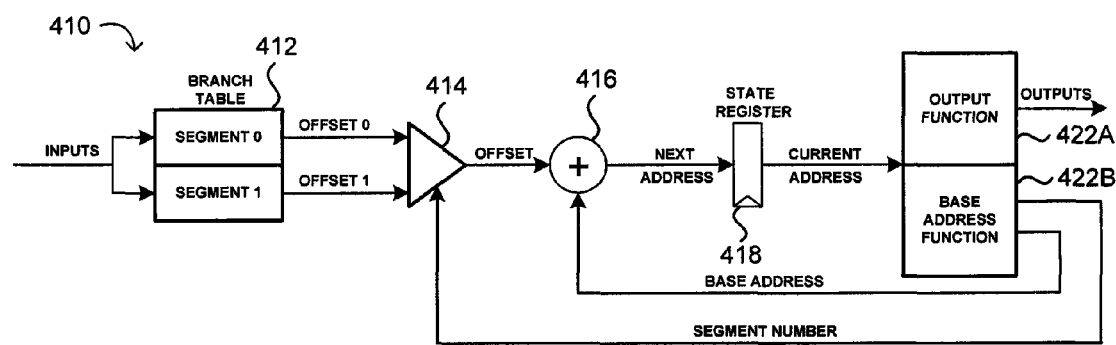
FIG. 4A is a diagram of an illustrative finite-state machine design implemented in a configurable storage circuit and using two memory segments to store the branch table in accordance with an embodiment of the present invention.
Figure 4B:
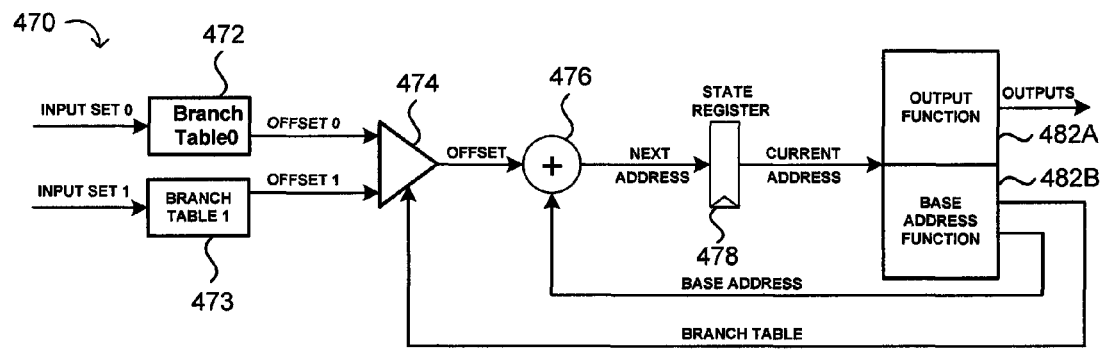
FIG. 4B is a diagram of an illustrative finite-state machine design implemented in a configurable storage circuit and using two branch tables in accordance with an embodiment of the present invention.

The number of finite-state machine inputs and thus the number of unique input combinations in the next state function of the finite-state machine may be large (e.g., for large, complex FSMs) and the number of distinct offset values may increase with the number of states due to an increased probability of distinct state transitions. An increased number of offset values may in turn lead to an increase in memory array usage for storing the output function and the base address function. The problem may be alleviated by partitioning the states of the FSM into sets of states and computing different offset values for each set whereby the different sets may have the same offset values. For example, a first set of states may have offset values "0" and "1", and a second set of states may have offset values "0", "1", and "2". FIGS. 4A and 4B show embodiments of FSM implementations in configurable storage blocks that have partitioned the states into two sets and computed different offset values for each of the sets.

The embodiment of FSM 410 shown in FIG. 4A may store the two sets of offset values of the branch table in two separate segments of the same memory array 412. As shown, selector circuit 414 may select between the offset value stored in the first segment and the offset value stored in the second segment based on a segment number stored together with the base address function 422B in the memory array. The selected offset value may then be added (e.g., using adder circuit 416) to the base address which may be stored in the memory array to compute the next address. State register 418 may store the next address as the current address and access output function 422A to retrieve the outputs from the memory array.

The embodiment of FSM 470 shown in FIG. 4B may store the two sets of offset values of the branch table in two separate memory arrays 472 and 473. As shown, selector circuit 474 may select between the offset value stored in memory array 472 and the offset value stored in memory array 473 based on a branch table number stored together with the base address function 482B in the memory array. The selected offset value may then be added (e.g., using adder circuit 476) to the base address which may be stored in the memory array to compute the next address. State register 478 may store the next address as the current address and access output function 482A to retrieve the outputs from the memory array.

Embodiments using multiple branch tables are different from embodiments using segmented branch table, at least in part because the embodiments using multiple branch tables are typically implemented using separate memory arrays and addressed using different sets of inputs. In addition, embodiments using multiple branch tables and embodiments using segmented branch tables are typically used to achieve different design objectives, e.g., a segmented branch table embodiment may result in an implementation having one big memory array as compared to a multiple branch table embodiment that may result in an implementation having several smaller memory arrays.

The two concepts may be combined to take full advantage of both. For example, an embodiment of an FSM may have multiple segmented memory arrays. In this embodiment, the base address function may select a branch table and a segment within that branch table.

Figure 4C:
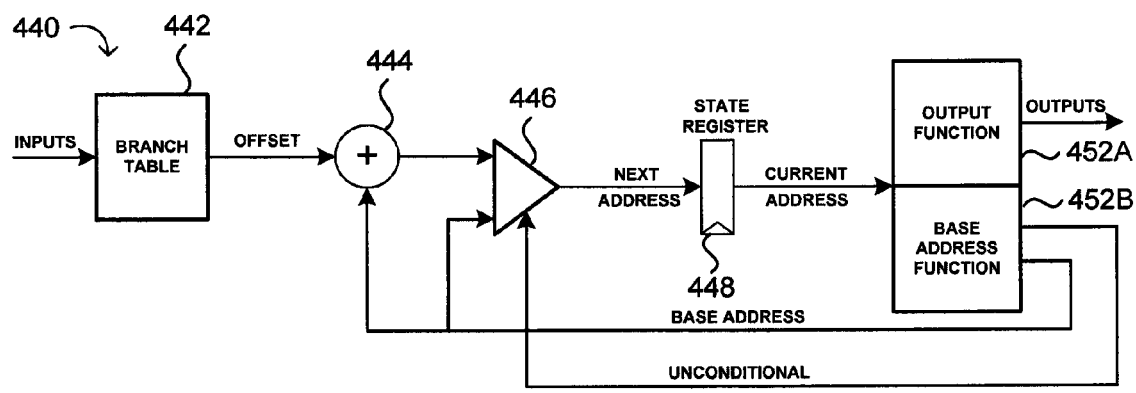
FIG. 4C is a diagram of an illustrative finite-state machine design with unconditional state transitions implemented in a configurable storage circuit in accordance with an embodiment of the present invention.

Some FSMs may contain states that transition to only one next state independent of the inputs. There is no need to determine offset values for such states and a base address may suffice. FIG. 4C shows an embodiment of a finite-state machine implementation in a configurable storage block where at least one of the states always transitions to the same next state independent of the inputs. The implementation of this FSM may add one control bit to base address function 452B to indicate whether a state has an unconditional state transition. Adder circuit 444 may compute the sum of the offset value retrieved from branch table 442 and the base address retrieved from base address function 452B. Selector circuit 446 may select between the base address retrieved from base address function 452B and the sum computed by adder circuit 444 based on the control bit, potentially bypassing the adder circuit 444 and ignoring the inputs completely (e.g., based on the value of the control bit). Thus, only one location is allocated for this current state and if the control bit is set, then the base address is loaded directly as the next address into state register 448. In the event that the control bit is not set, adder circuit 444 may compute the next address. Note that the feature providing unconditional state transitions as shown in FIG. 4C is orthogonal to segmented branch tables as shown in FIG. 4A and multiple branch tables shown in FIG. 4B and may be combined together to provide greater benefit in terms of reducing memory usage.

Figure 5:
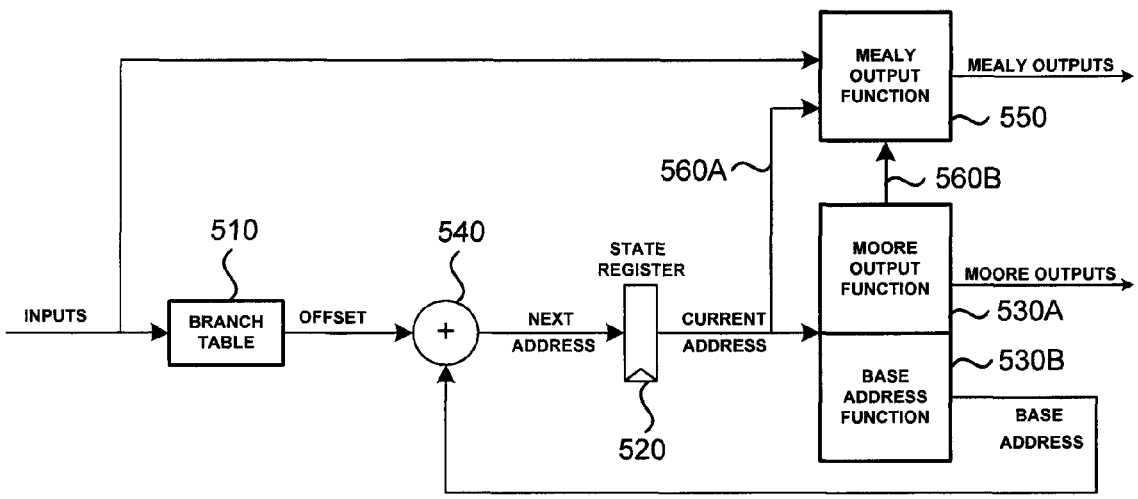
FIG. 5 is a diagram of an illustrative Mealy finite-state machine implemented in a configurable storage circuit in accordance with an embodiment of the present invention.

FIGS. 4A, 4B, and 4C show embodiments of finite-state machines implemented using configurable storage blocks for which the outputs only depend on the current state. As previously discussed, FSMs for which the outputs only depend on the current state are known as Moore FSMs. In contrast, Mealy FSMs compute their current outputs based in part on the inputs. FIG. 5 is a diagram of an illustrative Mealy finite-state machine implemented in a configurable storage circuit in accordance with an embodiment of the present invention.

The current address which is stored in state register 520 may reference the base address function 530B and the Moore output function 530A that are associated with the current state. Adder circuit 540 may add the offset retrieved from branch table 510 to the base address retrieved from base address function 530B to compute the next address that is associated with the next state.

The Moore output function 530A may produce the information related to the current state 560B needed to compute the Mealy outputs using Mealy output function 550. The Mealy output function 550 may combine the information related to the current state 560B with the current inputs to generate the Mealy outputs. The Mealy output function 550 may be implemented using an additional memory array which may be located inside or outside the configurable storage block. Alternatively, the Mealy output function 550 may be implemented using logic gates which may be located inside or outside the configurable storage block. For example, the Mealy output function 550 may be implemented using lookup tables (LUTs) that are located outside the configurable storage block.

Any Mealy FSM may be implemented using this structure. There is some delay, however, in computing the Mealy outputs, caused by computation of the Moore output function 530A followed by the Mealy output function 550. Thus, even if the inputs are available early in a clock cycle, there may be substantial delay before the Mealy outputs have been computed. The use of the current address 560A that is associated with the current state instead of the information related to the current state 560B produced by the Moore output function 530A may reduce this delay. In this embodiment, the Mealy output function 550 extracts the current state information from the current address 560A.

Since the Moore output function for the current state may be duplicated at many different locations, there may be many different addresses that correspond to a single state and this must be decoded by the Mealy output function 550. That is, the Mealy output function 550 may perform different operations based on whether the information related to the current state is received in form of the current address 560A or as information 560B from the Moore output function 530A.

The memory array of the configurable storage block described herein may be implemented using any storage technology (e.g., static random access memory (SRAM), dynamic random access memory (DRAM), flash memory, etc.). The functions implemented by the configurable storage block may apply to any memory array capacity, latency, and bandwidth, memory data-path implementation (e.g., common input/output or split input/output), number and type of configurable storage block interface ports, command/address/read-write control protocol, interface signaling method (e.g., parallel or serial), and the physical integration topology of the configurable storage block (e.g., single-die, 2.5-dimensional multiple-die, 3-dimensional stacked through-silicon-vias (3D TSV)).

The method and apparatus described herein may be incorporated into any suitable electronic device or system of electronic devices. For example, the method and apparatus may be incorporated into numerous types of devices such as microprocessors or other integrated circuits (ICs). Exemplary ICs include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The integrated circuit described herein may be part of a data processing system that includes one or more of the following components; a processor; memory; I/O circuitry; and peripheral devices. The integrated circuit can be used in a wide variety of applications, such as computer networking, data networking, instrumentation, video processing, digital signal processing, or any suitable other application where the advantage of using configurable storage circuitry is desirable.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. Circuitry, comprising:
   input and output ports;
   a storage circuit coupled to the output ports that has multiple address locations that each store respective base addresses and output data;
   a state register that stores a current address identifying an address location of the storage circuit; and
   a processing circuit that updates the current address stored in the state register based on input data received at the input ports and the base address stored at the identified address location of the storage circuit.

2. The circuitry of claim 1, wherein the processing circuit comprises an arithmetic operator circuit that receives the input data and the base address and performs a predetermined arithmetic function on the received input data and base address to compute the updated current address.

3. The circuitry of claim 1, wherein the storage circuit further stores a selection signal at the current address, the circuitry further comprising:
   a selector circuit coupled to the state register that receives the updated current address from the processing circuit and the base address and the selection signal from the storage circuit and selects between the updated current address and the base address based on the selection signal.

4. The circuitry of claim 1 further comprising:
   an additional processing circuit that receives the input data from the input ports and the output data from the storage circuit and computes additional output data of the finite-state machine based on the input data and the output data.

5. The circuitry of claim 4, wherein the additional output data is stored in an additional storage circuit at an additional address, and wherein the additional processing circuit computes the additional address based on the input data and the output data.

6. The circuitry of claim 1 further comprising:
   an additional storage circuit coupled between the input ports and the processing circuit, wherein the additional storage circuit provides at least one offset value to the processing circuit based on the input data received from the input ports.

7. The circuitry of claim 6 further comprising:
   a second additional storage circuit coupled between the input ports and the processing circuit, wherein the second additional storage circuit provides at least one offset value to the processing circuit based on the input data received from the input ports.

8. The circuitry of claim 7, wherein the storage circuit further stores a selection signal at the current address, the circuitry further comprising:
   a selector circuit coupled to the processing circuit that receives multiple offset values and selects between the multiple offset values based on the selection signal.

9. A method for operating a memory block on a programmable integrated circuit, the method comprising:
- receiving a mode selection command at an input of the memory block;
- selecting between a first and second operation mode based on the mode selection command;
- in response to selecting the first operation mode, operating the memory block as a random-access memory; and
- in response to selecting the second operation mode, operating the memory block as a finite-state machine.

10. The method of claim 9, wherein operating the memory block as the finite-state machine comprises:
- receiving input data at input ports of the memory block;
- retrieving a base address for a current state at a current address of a storage circuit of the memory block; and
- with a processing circuit of the memory block, computing a next address for a next state based on the input data and the base address.

11. The method of claim 10 further comprising:
- storing the next address for the next state; and
- retrieving output data for the next state at the next address of the storage circuit.

12. The method of claim 11 further comprising:
- retrieving additional output data for the next state based on the output data and the input data.

13. The method of claim 11 further comprising:
- retrieving an unconditional state-change command for the current state at the current address of the storage circuit of the memory block; and
- with a selector circuit, selecting between the retrieved base address and the computed next address based on the unconditional state-change command.

14. The method of claim 11 further comprising:
- computing an offset value based on the input data; and
- with the processing circuit, computing the next address for the next state based on the offset and the base address.

15. The method of claim 14 further comprising:
- retrieving an offset selection command for the current state at the current address of the storage circuit of the memory block;
- computing an additional offset value based on the input data; and
- with a selector circuit, selecting between the offset value and the additional offset value based on the offset selection command.

16. A method for using a logic design system to configure storage circuitry for implementing a finite-state machine with multiple states, the method comprising:
- receiving a next state function of the finite-state machine, wherein the next state function determines a next state of the finite-state machine based on a current state and input data;
- generating offset values based on the input data and the next state function;
- generating a base address for each state of the finite-state machine; and
- storing the base address for the next state in a location of the storage circuitry that is based on a selected one of the offset values and the base address of the current state.

17. The method of claim 16, wherein generating the offset values further comprises:
- identifying a subset of states of the multiple states;
- partitioning the input data into groups, wherein the next state function produces an identical state transition for each state of the subset of states and for each group of the input data; and
- assigning an offset value to each group of input data of the subset of states.

18. The method of claim 17 further comprising:
- determining whether the next state is in the subset of states; and
- in response to determining that the next state is in the subset of states, storing an identifier for the identified subset of states in the location of the storage circuitry that is based on the selected one of the offset values and the base address of the current state.

19. The method of claim 17 further comprising:
- for each input data combination, storing the assigned offset value in an additional location of the storage circuitry that is based on the input data.

20. The method of claim 17, wherein generating the base address for each state of the finite-state machine further comprises:
- assigning a first base address to a first state of the finite-state machine.

21. The method of claim 20 further comprising:
- identifying a number of offset values assigned to the subset of states with the first state;
- computing a second base address based on the first base address and the number of offset values; and
- assigning the second base address to a second state of the finite-state machine.

22. The method of claim 16 further comprising:
- receiving an output function of the finite state machine, wherein the output function determines output data for each of the multiple states; and
- storing the output data in the location of the storage circuitry that is based on the selected one of the offset values and the base address of the current state.

* * * * *